United States Patent [19]

Britton

[11] 4,031,511

[45] June 21, 1977

[54] CMOS COMPARATOR

[75] Inventor: James S. Britton, Raleigh, N.C.

[73] Assignee: Westinghouse Electric Corporation, Pittsburgh, Pa.

[22] Filed: Apr. 27, 1976

[21] Appl. No.: 680,655

[52] U.S. Cl. .............................. 340/146.2; 307/205; 307/216; 307/251
[51] Int. Cl.² ...................... G06F 7/04; H03K 5/20
[58] Field of Search ............... 307/205, 216, 235 F, 307/235 V, 251; 340/146.2

[56] References Cited

UNITED STATES PATENTS 3,598,979 8/1971 Moreau .......................... 307/205 X
3,604,944 9/1971 Gundersen et al. ............... 307/205

Primary Examiner—R. Stephen Dildine, Jr.
Attorney, Agent, or Firm—D. R. Lackey

[57] ABSTRACT

A comparator formed of complementary MOS gates. A variable-fixed word comparator for a word length of N-bits requires only N pairs of complementary MOS devices. A variable-variable word comparator for a word length of N-bits requires only 2 N pairs of complementary MOS devices.

14 Claims, 9 Drawing Figures

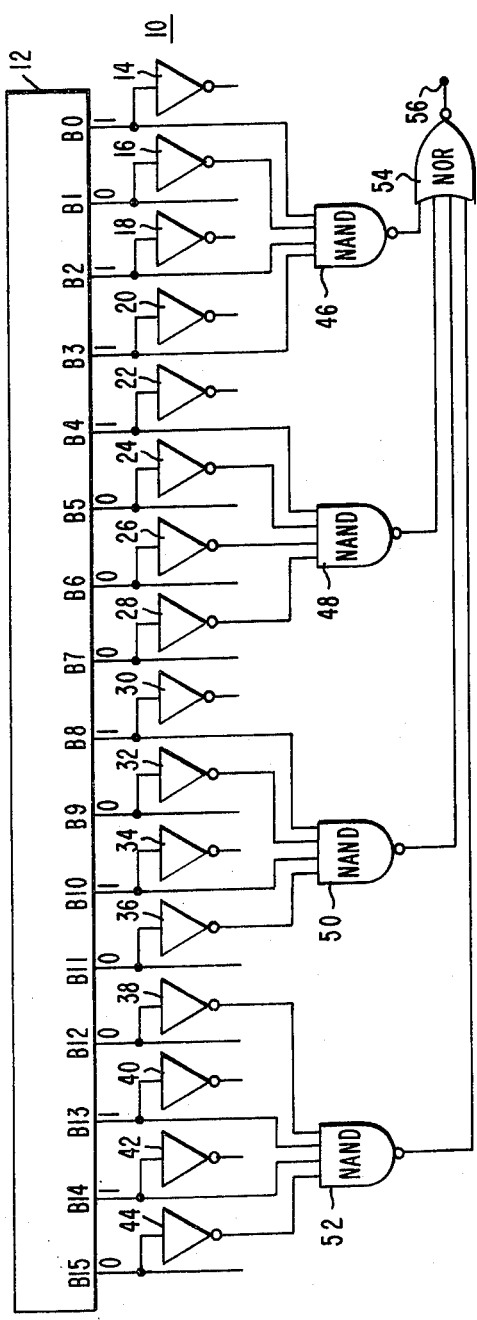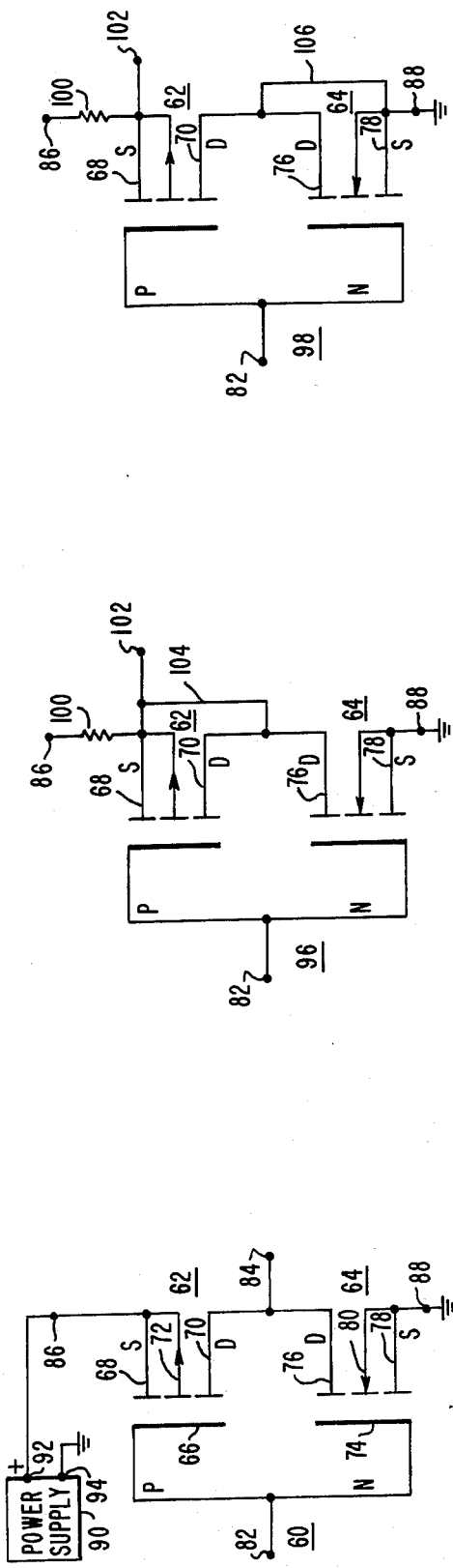

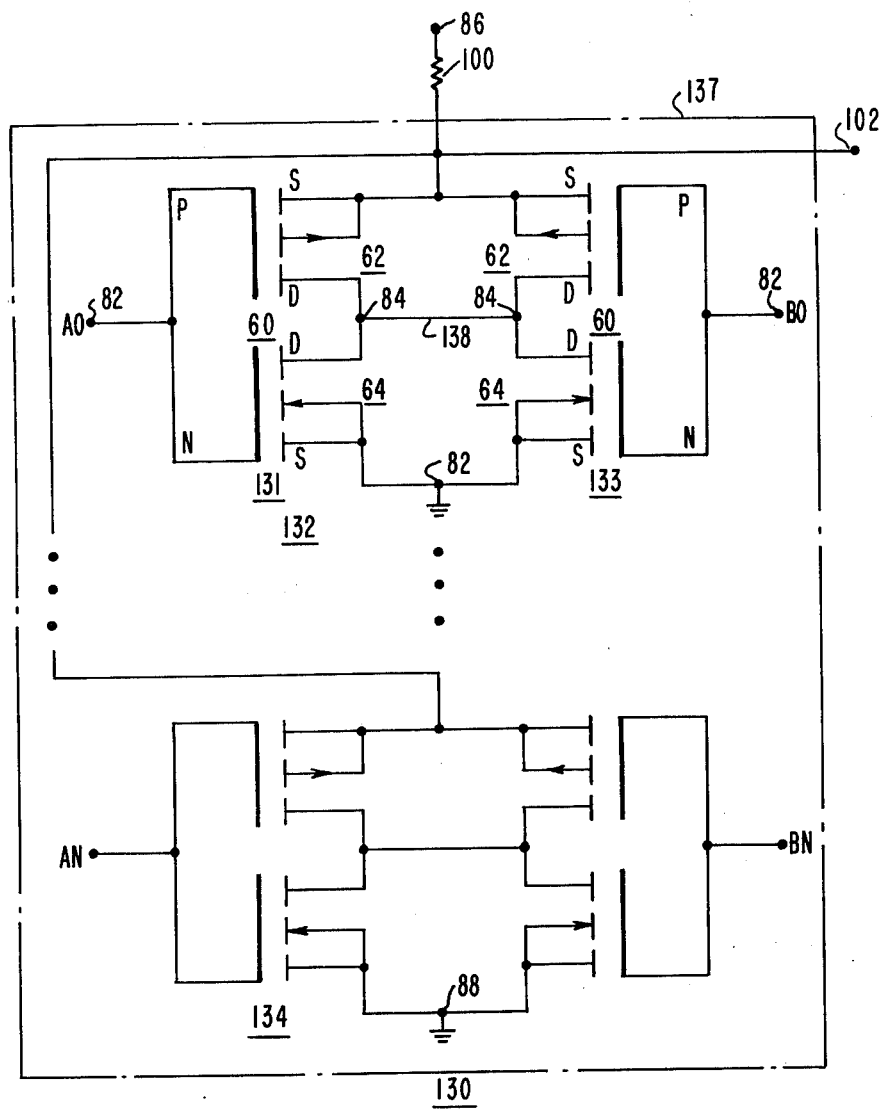
FIG. 7
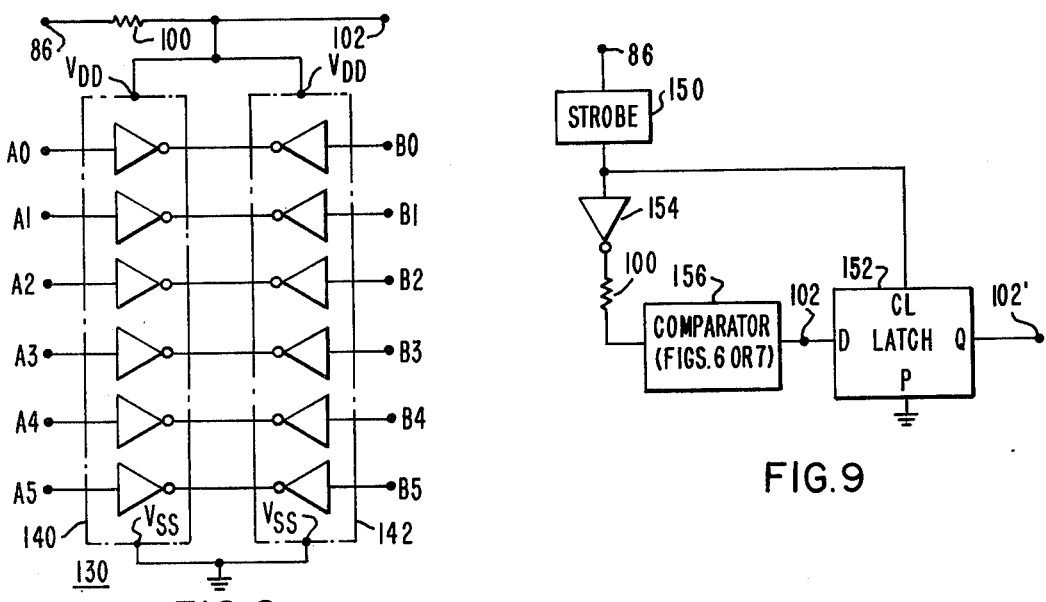
FIG. 8
FIG. 9

CMOS COMPARATOR

BACKGROUND OF THE INVENTION

1. Field of the Invention

The invention relates in general to comparators, and more specifically, to digital comparators formed of MOS gates.

2. Description of the Prior Art

Digital word comparators are required in various digital control, computer and logic applications. A typical application is the decoding or recognition of a word consisting of N-bits. For example, in digital communications it is necessary for a remote receiving point to recognize when it is uniquely addressed by a digital word of N-bits. A 16-bit address word would have $2^{16}$ or 65,536 different combinations, and a given location must recognize a specific one of these combinations. Thus, the addressed location requires a variable-fixed word comparator. It is also often necessary to compare two variable words and to determine when they are equal.

The advantages of using the metal-oxide-semiconductor (MOS) field effect transistor in integrated digital logic arrays makes it attractive to provide digital word comparators with MOS devices.

A typical fixed-variable word comparator using integrated circuit gates requires sixteen inverters or NOT gates for obtaining the complement of each bit, four four-input NAND gates, and a four-input NOR gate. The fixed word to be recognized is implemented by connecting the 16 inputs of the NAND gates to the bits of the words, or the complements of the bits, as required to provide all logic ones to the NAND gate inputs when the variable word is equal to the specific fixed word. The outputs of the four NAND gates are connected to the inputs of the NOR gate. Thus, when the variable word is equal to the fixed word, the outputs of all four NAND gates will be at the logic zero level, and the output of the NOR gate will be a logic one, indicating equality. This arrangement requires 72 field effect transistors, and a total of six integrated circuit (IC) packages.

It would be desirable to be able to provide a digital comparator which requires fewer gates and fewer IC packages. The reduced package count will reduce the cost of the comparator when selecting standard available IC packages, and the lower gate count will reduce the chip cost of a "custom" integrated circuit.

SUMMARY OF THE INVENTION

Briefly, the present invention is a new and improved digital comparator constructed of complementary MOS field effect transistors, which requires fewer gates and fewer standard IC packages than prior art comparators. Each bit of the word to be recognized requires a pair of complementary field effect transistors, i.e., a p-channel and an n-channel device, connected in series to a power supply. The variable bit is connected to the gates of the pair, and commonly connected drains of the pair are connected to the source of one of the transistors. If the bit of the fixed word is a logic zero, the drains are connected to the source of the p-channel device, and if the bit of the fixed word is a logic one, the drains are connected to the source of the n-channel device.

A 16-bit variable-fixed word comparator constructed according to the teachings of the invention requires only 2 N or 32 field effect transistors (FETS), which is a saving of 40 FETS compared with the conventional arrangement, and it may be implemented with three standard IC packages. A 32 bit variable-fixed word comparator would require only 64 FETS, a saving of 168 FETS compared with a conventional 32 bit digital word comparator, and it may be implemented with only six standard IC packages.

A variable-variable word detector for N-bit words is also disclosed, which requires only 2 N pairs of complementary MOS devices.

BRIEF DESCRIPTION OF THE DRAWING

The invention may be better understood, and further advantages and uses thereof more readily apparent, when considered in view of the following detailed description of exemplary embodiments, taken with the accompanying drawings in which:

FIG. 1 is a logic diagram which illustrates a variable-fixed 16-bit word comparator of the prior art;

FIG. 2 is a schematic diagram illustrating a complementary inverter of the prior art;

FIG. 3 is a schematic diagram which illustrates a variable-fixed bit comparator constructed according to the teachings of the invention, connected to recognize a logic zero;

FIG. 4 is a schematic diagram which illustrates a variable-fixed bit comparator constructed according to the teachings of the invention, connected to recognize a logic one;

FIG. 7 is a schematic diagram of a variable-variable word comparator for N-bit words, constructed according to the teachings of the invention;

FIG. 8 is a logic diagram of a variable-variable word comparator which illustrates an implementation of the comparator shown in FIG. 7 for a fixed-bit word; and FIG. 9 illustrates an arrangement for reducing power consumption which may be used with the comparators of the invention.

DESCRIPTION OF PREFERRED EMBODIMENTS

Figure 5:
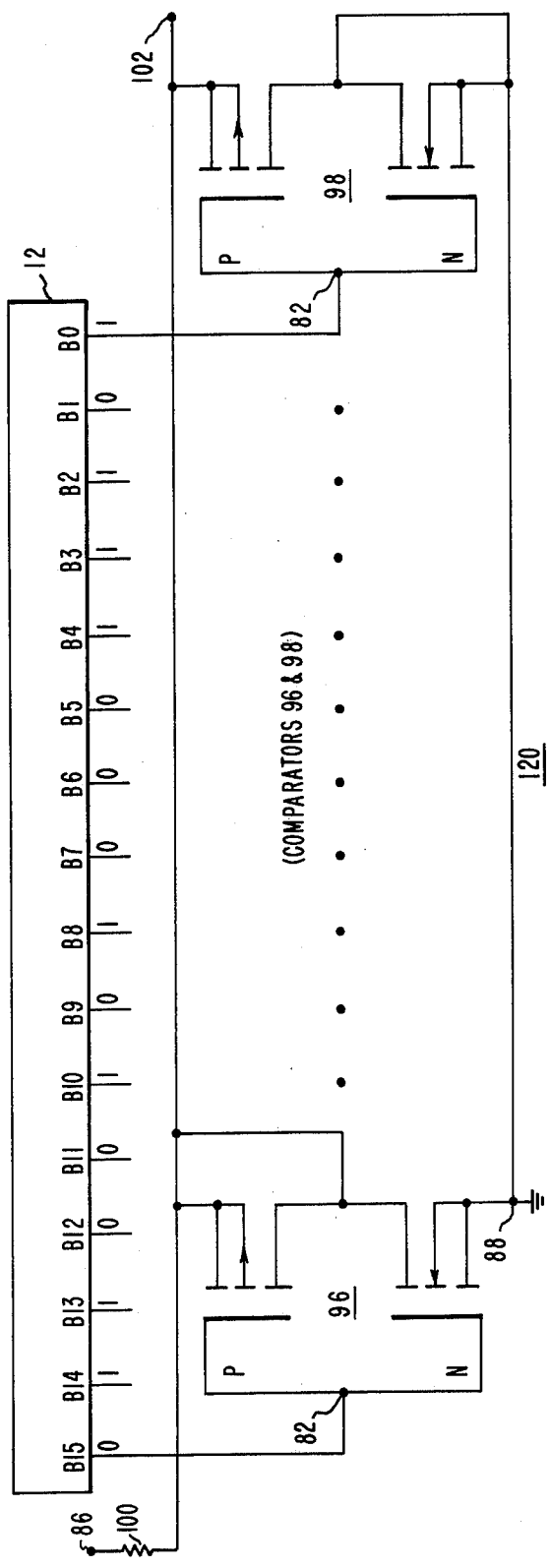
FIG. 5 is a schematic diagram of a 16-bit variable-fixed word comparator constructed according to the teachings of the invention.

Referring now to the drawings, and to FIG. 1 in particular, there is shown a logic diagram of a 16-bit comparator 10 constructed according to the teachings of the prior art. The variable word to be compared with a predetermined fixed word is provided by a device 12 which may be a counter, a storage register, a shift register, or the like. Each of the 16 outputs B0 through B15 of device 12 is connected to an inverter or NOT gate, with outputs B0 through B15 being connected to inverters 14, 16, 18, 20, 22, 24, 26, 28, 30, 32, 34, 36, 38, 40, 42 and 44, respectively.

Four four-input NAND gates 46, 48, 50 and 52 are also required, along with a four-input NOR gate 54.

The 16 outputs of device 12 are connected to the 16 inputs of the NAND gates 46, 48, 50 and 52, either directly or via the associated inverter, according to the bit pattern of the fixed word. If a particular bit location of the fixed word is a zero, the output of device 12 associated with this bit location will be connected to a NAND gate via an inverter to provide a logic one to the NAND gate input when the variable bit matches the fixed bit. If the bit of the fixed word is a one, the output of device 12 will be connected directly to a NAND gate input. Thus, when the variable word provided by device 12 matches the fixed word selected by the connection of outputs B0, B2, B3, B4, B8, B10, B13 and B14 of device 12 and the outputs of inverters 16($\overline{B1}$), 24($\overline{B5}$), 26($\overline{B6}$), 28($\overline{B7}$), 32($\overline{B9}$), 36($\overline{B11}$), 38($\overline{B12}$), and 44($\overline{B15}$) to the inputs of the NAND gates, all four NAND gates will output a logic zero. The outputs of the NAND gates 46, 48, 50 and 52 are connected to the four inputs of NOR gate 54, and when all inputs of the NOR gate are a logic zero, the output of the NOR gate will be a logic one. Any logic one input to the NOR gate 54 results in a logic zero output. Thus, NOR gate 54 provides a logic one at output terminal 56 only when the variable 16-bit word is equal to the selected 16-bit fixed word. FIG. 1 illustrates a fixed word equal to 0110 0101 0001 1101.

The comparator 10 may be implemented with three hex inverter IC packages, such as RCA's CD4069B, with two gates or transistors being required per inverter, two dual four-input NAND gate IC packages, such as RCA's CD4012A, with eight gates or transistors per NAND gate, and with a four-input NOR gate IC package, such as RCA's dual four-input NOR gate CD4002A, which has eight gates or transistors per NOR function.

FIG. 2 is a schematic diagram of a complementary inverter 60 of the prior art, which is illustrated as the present invention utilizes the complementary pair of the prior art inverter, but with different connections. Inverter 60 comprises serially connected complementary enhancement mode field effect transistors, including a p-channel transistor 62 and an n-channel transistor 64. Transistor 62 includes a gate 66, a source 68, a drain 70 and a substrate 72. Transistor 64 includes a gate 74, a drain 76, a source 78, and a substrate 80. The gates 66 and 74 are connected in common to an input terminal 82, the drains 70 and 76 are connected in common to an output terminal 84, the substrate 72 and source 68 of transistor 62 are connected in common to a positive power supply terminal 86, and the source 78 and substrate 80 of transistor 64 are connected in common to a negative power supply terminal 88. A unidirectional power supply 90 is provided having positive and negative output terminals 92 and 94, respectively, with the positive terminal 92 being connected to terminal 86. The negative terminal 94 is connected to terminal 88, and as illustrated in FIG. 2, terminals 94 and 88 are usually connected to ground. The output of inverter 60 appears across terminals 84 and 88.

In the operation of the inverter 60, the p-channel MOS 62 is used as the load for the n-channel MOS amplifier device. When the input signal is a logic zero, the n-channel device 64 is turned off, the p-channel device is turned on, and the output appearing at terminal 84 is at the level of the positive supply voltage connected to terminal 86. When the input signal is a logic one, the n-channel device 64 is on, the p-channel device is off, and the output terminal 84 is at the voltage level of terminal 88, i.e., ground.

The invention utilizes the serially connected complementary pair shown in FIG. 2, except instead of the output being the commonly connected drains, the output is taken from the source of the p-channel device, and the source of the p-channel device is connected to the positive power supply terminal 86 via a load resistor, such as the load resistor 100 shown in FIGS. 3 and 4. The load resistor 100 may typically be 50K ohms. The commonly connected drains are connected to the source of one of the devices, with the selected device depending upon the logic level of the associated bit of the fixed word.

More specifically, FIGS. 3 and 4 are schematic diagrams of single bit comparators 96 and 98, respectively, constructed according to the teachings of the invention. Comparators 96 and 98 are single bit variable-fixed word comparators, with the fixed words being logic zero, and logic one, respectively. Components in FIGS. 3 and 4 which are similar to those of FIG. 2 are given the same reference numerals used in FIG. 2. The output terminal of comparators 96 and 98 is referenced 102, since it is located at a different point, i.e., it is connected to the source 68 of the p-channel transistor 62.

FIG. 3 illustrates a single bit fixed-variable comparator 96 connected to provide a logic one at its output terminal 102 when the fixed word is a logic zero and the variable word is equal to the fixed word. For a single bit comparator where the fixed word is a logic zero, the commonly connected drains 70 and 76 are connected to the source 68 of the p-channel transistor 62 via connector 104. When the input signal at the input terminal 82 is a logic one, the p-channel device 62 is off and the n-channel device is on. Thus, the output terminal 102 is connected to ground via connector 104 and device 64. The logic zero output at terminal 102 indicates that the variable word is not equal to the fixed word. When the input signal at terminal 82 is a logic zero, the p-channel device 62 is on and the n-channel device 64 is off. The voltage at output terminal 102 is thus the positive voltage applied to terminal 86, i.e., a logic one. The logic one output indicates the variable word is equal to the fixed word.

FIG. 4 illustrates a single bit fixed-variable comparator 98 connected to provide a logic one at its output terminal 102 when the fixed word is a logic one, and the variable word is equal to the fixed word. For a single bit comparator where the fixed word is a logic one, the commonly connected drains 70 and 76 are connected to the source 78 of the n-channel transistor 64 via connector 106. When the input signal at the input terminal 82 is a logic one, the p-channel device 62 is off and the n-channel device is on. Thus, the output terminal 102 is at the potential of terminal 86, i.e., a logic one. The logic one output at terminal 102 indicates that the variable word is equal to the fixed word. When the input signal at terminal 82 is a logic zero, the p-channel device 62 is on and the n-channel device 64 is off. The output terminal 102 is thus connected to ground via transistor 62 and connector 106. The logic zero output indicates the variable word is not equal to the fixed word.

FIG. 5 is a schematic diagram illustrating a variable-fixed word comparator 120, wherein the words have a plurality of bits. For purposes of example, comparator 120 is illustrated for a 16-bit word, but the comparator 120 may be constructed for any N-bit word. Comparator 120 is constructed with the same 16-bit fixed word used in FIG. 1. To construct the comparator 120, it is only necessary to provide the single bit comparator 96 of FIG. 3 or the single bit comparator 98 of FIG. 4, for each bit of the word, with comparator 96 being provided when the associated bit of the fixed word is zero, and with comparator 98 being provided when the associated bit of the fixed word is a one. The various single bit comparators are then connected in parallel, with their inputs being connected to an output of device 12. In other words, the sources of all of the p-channel devices are connected in common to terminal 86 via resistor 100, and also to output terminal 102, and the sources of the n-channel devices are all connected to terminal 88. Outputs B0, B2, B3, B4, B8, B10, B13 and B14 are all associated with bit positions which correspond to a logic one of the fixed word, and their outputs are all connected to single bit comparators 98. Since they are all similar, only output B0 is shown connected to a comparator 98. Outputs B1, B5, B6, B7, B9, B11, B12 and B15 are all associated with bit positions which correspond to a logic zero of the fixed word, and these outputs are all connected to single bit comparators 96. Since they are all similar, only output B15 is shown connected to a comparator 96.

In the operation of comparator 120, if any bit of the variable word does not match the associated bit of the fixed word, the output 102 will be connected to terminal 88 and provide a logic zero at terminal 102. When all bits of the variable word match the associated bits of the fixed word, terminal 102 will be at the logic one level.

Figure 6:
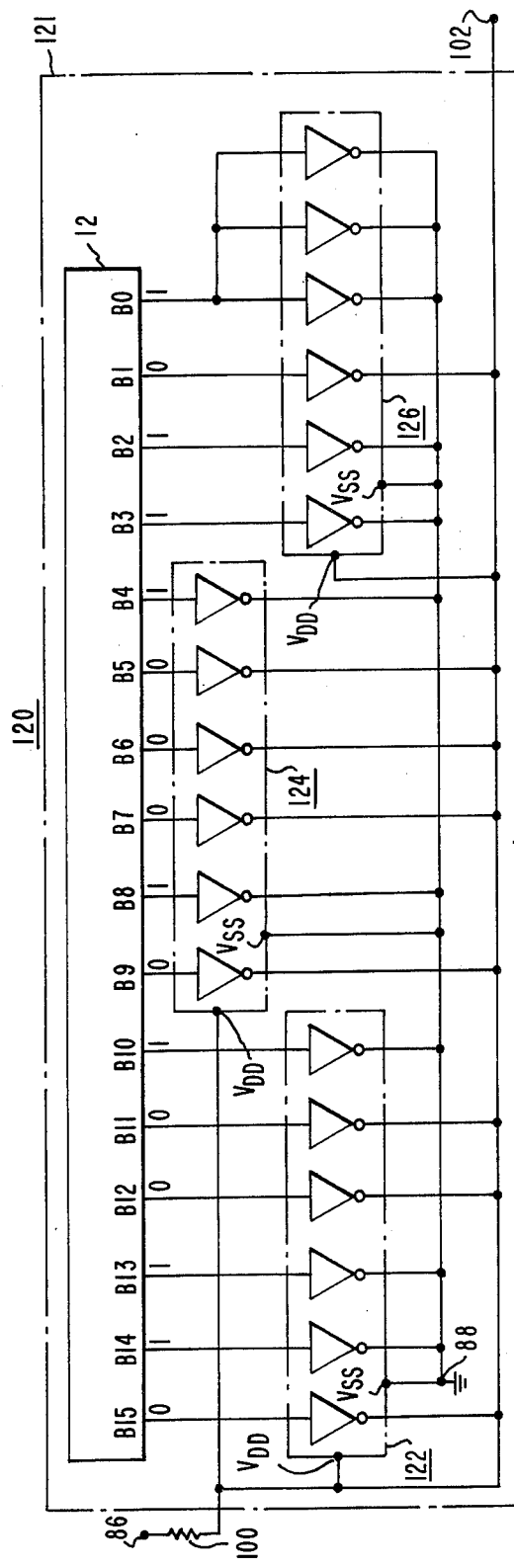
FIG. 6 is a logic diagram illustrating an implementation of the comparator shown in FIG. 5 utilizing three standard IC packages.

Since six inverters are available on a standard IC package, only three IC packages would be required to implement the 16-bit variable-fixed word comparator 120 shown in FIG. 5. FIG. 6 illustrates comparator 120 implemented with three IC hex inverter packages 122, 124 and 126. The inverter outputs are connected to either $V_{DD}$ or $V_{SS}$, as required to detect the desired fixed word. Any unused inverters in a package should be connected in parallel with a "used" inverter, as illustrated relative to the two inverters at the extreme right side of IC package 126. An inverter IC package should be selected which does not have protective diodes connected from the gates to $V_{DD}$. RCA's hex inverter package CD4049A would be suitable for each of the IC packages 122, 124 and 126.

FIG. 7 is a schematic diagram of a variable-variable word comparator 130 constructed according to another embodiment of the invention, which provides a logic one at an output terminal when two variable words are equal. The variable words may each be a single bit, or they may have N-bits. Each single bit detector is of like construction, with comparator 130 being illustrated comparing two words of N-bit length. Only the first bit and the $N^{th}$ bit comparators 132 and 134, respectively, are illustrated in FIG. 7, since each of the comparators are of like construction.

Each of the single bit comparators, such as comparator 132, comprises first and second pairs 131 and 133, respectively, of complementary MOS devices, with each pair being connected as illustrated in FIG. 2. In other words, comparator 132 includes two like constructed inverters 60, such as shown in FIG. 2. Like reference numerals in FIGS. 7 and 2 indicate like components. The normal outputs 84 of each pair are connected in common via connector 138. The sources of the p-channel devices 62 of the two pairs are connected in common to output terminal 102, and also to the positive power supply terminal 86 via the load resistor 100. The sources of the n-channel devices of the two pairs are connected to negative power supply terminal 88. Each of the single bit variable word comparators, such as comparators 132 and 134, are connected in parallel between the output terminal 102 and power supply terminal 88.

In the operation of a single bit comparator, such as comparator 132, the two bits A0 and B0 to be compared are applied to the input terminals 82 of the first and second complementary pairs 131 and 133, respectively. If signals A0 and B0 are both at the logic zero level, the p-channel devices 62 of both pairs will be on, and the n-channel devices 64 of both pairs will be off. Thus, the output terminal 102 will be at the voltage level of the positive power supply terminal 86, i.e., a logic one. If signals A0 and B0 are both at the logic one level, the p-channel devices 62 of both pairs will be off, and the n-channel devices 64 of both pairs will be on. Again, the output terminal 102 will be at the voltage level of the positive power supply terminal 86, i.e., a logic one. If signal A0 is a logic one and signal B0 is a logic zero, the n-channel device 64 of pair 131 will be on and the p-channel device of pair 133 will be on, connecting the output terminal 102 to the negative power supply terminal 88 via transistor 62 of the second pair 131, connector 138, and transistor 64 of the first pair 131. If signal A0 is a logic zero and signal B0 is a logic one, the output terminal 102 is connected to the negative power supply terminal 88 via transistor 62 of the first pair 131, connector 138, and transistor 64 of the second pair 133. When the variable words to be compared have a plurality of bits, if the logic levels of any bit location do not match, the output terminal 102 will be connected to the negative power supply terminal 88, and the output will thus be at the logic zero level. The output terminal 102 will only go to the logic one level when the two variable words are equal to one another.

FIG. 8 is a logic diagram of the comparator 130 shown in FIG. 7, with N being equal to 6. Thus, two hex IC inverter packages 140 and 142 may be used, with the inputs of IC package 140 being connected to word A0–A5, the inputs of IC package 142 connected to word B0–B5, the outputs of the two IC packages are connected in common at each like bit location, the negative power supply input terminal $V_{SS}$ of each pair is connected to ground, and the positive power supply input terminal $V_{DD}$ of each package is connected to output terminal 102, and also to the positive power supply terminal 86 via resistor 100.

While the resistor 100 in the various embodiments may typically 50K ohms, the comparators of the invention will draw power at a level which is high by CMOS standards, at least during certain operating conditions, such as when unequal words are detected. Various arrangements may be used to reduce power consumption, to make it compatible with the miniscule power requirements of CMOS devices. FIG. 9 illustrates an arrangement which may be used which utilizes a strobe 150, a latch 152, and an inverter 154. The rectangle 156 indicates either the comparator of FIG. 6, or the comparator of FIG. 7, with the portions of these comparators which would be within the rectangle 156 being indicated by broken line enclosures 121 and 137 in FIGS. 6 and 7, respectively.

The strobe 150 and inverter 154 provide a strobed power supply for the comparator 156 via resistor 100, and the output appearing at output terminal 102 each time comparator 156 is strobed is stored in the latch 152. Latch 152, which may be RCA's CD4042, has its polarity input P connected to ground, its D input connected to output terminal 102, its CL input connected to the junction between the strobe 150 and inverter 154, and its Q output is connected to output terminal 102'.

I claim as my invention:

1. A single bit comparator for comparing a variable word with a fixed word, comprising:
   a pair of complementary MOS devices including a p-channel MOS and an n-channel MOS having their gates connected in common and their drains connected in common,
   said drains being connected to the source of a selected one of the MOS devices, with the selected MOS device being responsive to the logic level of the fixed word,
   a power supply having first and second terminals,
   a load resistor,
   the source of said p-channel MOS being connected to the first terminal of said power supply via said load resistor,
   the source of said n-channel device being connected to the second terminal of said power supply,
   an input terminal for receiving the variable word, said input terminal being connected to said gates, and
   an output terminal for indicating when the variable word is equal to the fixed word, said output terminal being connected to the source of said p-channel MOS device.

2. The comparator of claim 1 wherein the power supply includes means for reducing the power consumption of the comparator.

3. The comparator of claim 2 wherein the means for reducing power consumption includes a strobe, and also including a latch responsive to said strobe, said latch being connected to the output terminal for storing the signal which appears at the output terminal when the comparator is strobed.

4. A comparator for comparing a variable word with a fixed word, comprising:
   a pair of complementary MOS devices for each bit of the variable word, with each pair being associated with a predetermined bit location of the fixed and variable words, each of said pairs including a p-channel MOS device and an n-channel MOS device having their gates connected in common and their drains connected in common,
   said drains of each pair being connected to the source of a selected one of the MOS devices of the pair, with the selected MOS device being responsive to the logic level of the associated bit of the fixed word,
   a power supply having first and second terminals,
   a load resistor,
   the source of said p-channel MOS device of each pair being connected to the first terminal of said power supply via said load resistor,
   the source of said n-channel MOS device of each pair being connected to the second terminal of said power supply.
   an input terminal for each pair connected to the gates, each input terminal being connected to the associated bit of the variable word, and
   an output terminal connected to the sources of the p-channel MOS devices,
   said output terminal indicating when the variable word is equal to the fixed word.

5. The comparator of claim 4, wherein the power supply includes means for reducing the power consumption of the comparator.

6. The comparator of claim 5 wherein the means for reducing power consumption includes a strobe, and including a latch responsive to said strobe, said latch being connected to the output terminal for storing the signal which appears at the output terminal when the comparator is strobed.

7. A comparator for comparing first and second variable bits, comprising:
   first and second pairs of complementary MOS devices, with each pair including a p-channel MOS device and an n-channel MOS device, with their drains all being connected in common,
   a power supply having first and second terminals,
   a load resistor,
   the sources of said p-channel MOS devices being connected to the first terminal of said power supply via said load resistor,
   the sources of said n-channel devices being connected to the second terminal of said power supply,
   first and second input terminals for receiving the first and second variable bits to be compared, said first input terminal being connected to the gates of the first pair of MOS devices, and the second input terminal being connected to the gates of the second pair of MOS devices,
   and an output terminal connected to the sources of said p-channel MOS devices, said output terminal indicating when the first and second bits are equal.

8. The comparator of claim 7 wherein the power supply includes means for reducing the power consumption of the comparator.

9. The comparator of claim 8 wherein the means for reducing power consumption includes a strobe, and including a latch responsive to said strobe, said latch being connected to the output terminal for storing the signal which appears at the output terminal when the comparator is strobed.

10. A comparator for comparing first and second variable words each having N bits, comprising:
    first and second pairs of complementary MOS devices for each of the N bits, with each of the first and second pairs being associated with a predetermined bit location of the first and second variable words, each of said first and second pairs including a p-channel MOS device and an n-channel MOS device, with the drains of the four MOS devices being connected in common,
    a power supply having first and second terminals,
    a load resistor,
    the sources of the p-channel MOS devices all being connected to the first terminal of said power supply via said load resistor,
    the sources of said n-channel devices all being connected to the second terminal of said power supply,
    a first input terminal for each of the first pairs connected to the gates, with each first input terminal being connectable to the associated bit of the first variable word,
    a second input terminal for each of the second pairs connected to the gates, with each second input terminal being connectable to the associated bit of the second variable word,
    and an output terminal connected to the sources of all of said p-channel MOS devices, said output terminal indicating when the first and second variable words are equal.

11. The comparator of claim 10, wherein the power supply includes means for reducing the power consumption of the comparator.

12. The comparator of claim 11, wherein the means for reducing power consumption includes a strobe, and including a latch responsive to said strobe, said latch being connected to the output terminal for storing the signal which appears at the output terminal when the comparator is strobed.

13. A digital comparator for detecting when an input signal is at a selected logic level, comprising:
a pair of complementary MOS devices consisting of p and n channel MOS transistors each having a gate, source, and drain,
first, second and third terminals,
said first terminal being connected to the gates of said transistors,
said second terminal being connected to the drains of said p and n-channel transistors,
a source of potential,
and a load resistor,
the source of said p-channel transistor being connected to said third terminal and to said source of potential via said load resistor,
the source of said n-channel transistor being connected to ground,
said first terminal being an input terminal to which the bit to be detected is applied, said second terminal being connected to the third terminal when the logic level of the signal to be detected is at a first level, and to ground when it is at a second level, said third terminal being an output terminal which indicates when the signal applied to the input terminal matches the logic level selected by the connection of the second terminal.

14. A digital comparator for detecting when first and second signals are at the same logic level, comprising:
first and second pairs of complementary MOS devices, with each pair consisting of p and n-channel MOS transistors each having a gate, source and a drain,
first, second and third terminals,
said first terminal being connected to the gates of the transistors of the first pair,
said second terminal being connected to the gates of the transistors of the second pair,
the drains of the p and n-channel devices of both pairs being connected in common,
a source of potential, and
a load resistor,
the sources of the p-channel transistors being connected in common, with the common connection being connected to the source of potential via said load resistor, and to the third output terminal,
the sources of the n-channel transistors of each pair being connected to ground,
said first and second terminals being input terminals to which the first and second signals to be compared are respectively applied,
said third terminal being an output terminal which indicates when the first and second signals are at the same logic level.

* * * * *